(12) United States Patent
Lay et al.

(10) Patent No.: US 7,041,589 B2
(45) Date of Patent: May 9, 2006

(54) METAL BUMP WITH AN INSULATING SIDEWALL AND METHOD OF FABRICATING THEREOF

(75) Inventors: Ming-Yi Lay, Hsinchu (TW); Yong-Fen Hsieh, Hsinchu Hsien (TW); Shang-Kung Tsai, Kaohsiung (TW); Chin-Kun Lo, Hsinchu Hsien (TW)

(73) Assignee: AU Optronics Corp., Hsinchu (TW)

( * ) Notice: Subject to any disclaimer, the term of this patent is extended or adjusted under 35 U.S.C. 154(b) by 72 days.

(21) Appl. No.: 10/656,248

(22) Filed: Sep. 8, 2003

(65) Prior Publication Data

US 2004/0048202 A1 Mar. 11, 2004

Related U.S. Application Data

(62) Division of application No. 09/764,207, filed on Jan. 19, 2001, now Pat. No. 6,958,539.

(30) Foreign Application Priority Data

Aug. 29, 2000 (TW) ................................ 89117464 A

(51) Int. Cl.
*H01L 21/4763* (2006.01)

(52) U.S. Cl. ....................................... 438/613

(58) Field of Classification Search ................ 438/613, 438/614; 257/734, 737, 738, 780, 781; 174/261
See application file for complete search history.

(56) References Cited

U.S. PATENT DOCUMENTS

| | | | | |
|---|---|---|---|---|
| 5,578,527 A | * | 11/1996 | Chang et al. | 156/273.9 |
| 5,783,465 A | * | 7/1998 | Canning et al. | 438/119 |
| 5,844,314 A | * | 12/1998 | Kim | 257/737 |
| 5,923,080 A | * | 7/1999 | Chun | 257/666 |
| 6,111,628 A | * | 8/2000 | Shiota et al. | 349/150 |
| 6,157,079 A | * | 12/2000 | Taguchi | 257/737 |
| 6,228,689 B1 | * | 5/2001 | Liu | 438/131 |
| 6,232,563 B1 | * | 5/2001 | Kim et al. | 174/261 |
| 6,683,384 B1 | * | 1/2004 | Kossives et al. | 257/777 |
| 6,822,336 B1 | * | 11/2004 | Kurita | 257/780 |
| 2001/0013651 A1 | * | 8/2001 | Nakazawa | 257/737 |
| 2004/0099941 A1 | * | 5/2004 | Standing | 257/693 |
| 2004/0262778 A1 | * | 12/2004 | Hua | 257/778 |
| 2005/0082670 A1 | * | 4/2005 | Quinones et al. | 257/737 |

FOREIGN PATENT DOCUMENTS

| | | | |
|---|---|---|---|
| JP | 64-44049 | * | 2/1989 |
| JP | 02-220863 | * | 9/1990 |
| JP | 3-228334 | * | 10/1991 |
| JP | 4-196434 | * | 7/1992 |
| JP | 06-008599 | * | 1/1994 |
| JP | 6-232211 | * | 8/1994 |
| JP | 08-072486 | * | 3/1996 |

(Continued)

*Primary Examiner*—M. Wilczewski
(74) *Attorney, Agent, or Firm*—Thomas, Kayden, Horstemeyer & Risley

(57) ABSTRACT

Metal bumps for connecting a nonconducting substrate and a chip without lateral shorting are provided. In a first preferred embodiment, an insulating layer covers the entire sidewalls of all the metal bumps. In a second preferred embodiment, predetermined portions of a first metal bump and a second metal bump are covered with an insulating layer. For example, a first predetermined portion of the sidewall of the first metal bump may be zcovered with an insulating layer, while a second predetermined portion of the sidewall of the second sidewall is also covered with an insulating layer.

4 Claims, 9 Drawing Sheets

FOREIGN PATENT DOCUMENTS

| | | | |
|---|---|---|---|
| JP | 2004-134653 | * | 4/2004 |
| JP | 2004-200552 | * | 7/2004 |
| JP | 2004-214374 | * | 7/2004 |
| KR | 00171099 | * | 10/1998 |
| KR | 00225398 | * | 7/1999 |
| KR | 2001056507 A | * | 7/2001 |

* cited by examiner

METAL BUMP WITH AN INSULATING SIDEWALL AND METHOD OF FABRICATING THEREOF

This application is a division of prior application Ser. No. 09/764,207 filed Jan. 19, 2001 now U.S. Pat. No. 6,958,539.

BACKGROUND OF THE INVENTION

1. Field of the Invention

The present invention relates to a metal bump and a method of fabricating thereof, and more particularly, to a metal bump with an insulating sidewall and a method of fabricating thereof.

2. Description of the Related Art

The attachment of a bared die to a glass panel (called COG: chip on glass) is one advanced application for electrically connecting integrated circuits (ICs) achieving lighter weight, smaller size, lower cost and less power consumption demanded in various display products. Consequently, COG has been successfully adopted for small products (less than 4 in.), such as display panels for telephones and copiers, which have one or two chips, medium-size products (4~11 in.), such as video cameras and navigation systems, which require 3~12 chips, and large products (more than 11 in.) for notebook PCs.

The quality and reliability of the liquid crystal display (LCD) module depends on the way in which the driver IC is attached to the glass panel. Anisotropic conductive film (ACF) is the most popular material for attaching the chip to the glass panel. ACF is an adhesive film consisting of dispersed, microscopic, electrically conductive particles 3~15 μm in diameter and an insulating adhesive film 15~35 μm thick. Various kinds of conductive particles, such as carbon fiber, metal (Ni, solder), and metal (Ni/Au)-coated plastic balls have been proposed, and the uniformity of the conductive particles distribution is considered an influence on the electrical property and reliability of ACF. Also, various types of adhesive materials, such as thermoplastic, thermosetting, and mixed thermoplastic and thermosetting materials have been proposed. In general, ACF is classified into two types. One has conductive particles 5 μm in diameter covered with a very thin insulating layer, wherein the thin insulating layer is broken when the particles are deformed, the bared conductive particles serving as a bridge for electrically connecting the metal bump on the chip and the bonding pad on the glass panel. However, the breaking of the conductive particles during the fabricating process cannot be ensured; therefore, there is no guarantee of effective contact between the metal bump and the bonding pad. The other type of ACF is a double-layer type, which consists of one layer filled with conductive particles 3 μm in diameter and the other layer with no conductive particles, so that the functions of conduction and adhesion are separated. This can ensure the effective contact between the metal bump and the bonding pad. Nevertheless, when too many conductive particles exist in the space between two adjacent metal bumps, a lateral connection between the two adjacent metal bumps is easily formed, resulting in an electrical short.

Please refer to FIG. 1A to FIG. 1C. FIG. 1A is a top view of the layout of a glass substrate 10 according to the prior art. FIG. 1B is a top view of the layout of the predetermined area 15 shown in FIG. 1A. FIG. 1C is a top view of the layout of a chip 20 according to the prior art. A glass substrate 10 of the LCD module comprises a first area 12 for disposing an array of thin film transistors (TFTs), a second area 14 for disposing data IC chips on the predetermined areas 15, and a third area 16 for disposing scan IC chips on the predetermined areas 15. Each predetermined area 15 comprises a plurality of first bonding pads 18. A chip 20 which is the data IC chip or the scan IC chip comprises a plurality of second bonding pads 22, wherein each second bonding pad 22 corresponds in position to each first bonding pad 18.

Please refer to FIG. 2A to FIG. 2D. FIG. 2A to FIG. 2D are schematic cross-sectional diagrams of a method of connecting the chip 20 and the glass substrate 10 according to the prior art. As shown in FIG. 2A, a schematic cross-sectional diagram along the line 2—2 shown in FIG. 1B, an ACF 24 is attached to the surface of the glass substrate 10 to cover the first bonding pad 18. As shown in FIG. 2B, a schematic cross-sectional diagram along the line 2'—2' shown in FIG. 1C, a metal bump 26 is fabricated on the second bonding pad 22 of the chip 20. As shown in FIG. 2C, the surface of the chip 20 is downwardly placed on the predetermined area 15 of the glass substrate 10, wherein each metal bump 26 corresponds to a first bonding pad 18 of the glass substrate 10. By means of the adhesion of the ACF 24 and the downwardly exerted pressure, the chip 20 is tightly attached to the glass substrate 10. A thermal process is then performed to cure the ACF 24. Therefore, the conductive particles 25 sandwiched between the top of the metal bump 26 and the surface of the first bonding pad 18 serve as an electrically connecting bridge. However, as shown in FIG. 2D, the distribution of the conductive particles 25 cannot be controlled in processing, and thereby many conductive particles 25 that exist between adjacent metal bumps 26 may laterally connect with each other to cause electrical shorts. Especially when the size of the metal bump 26 is incorrectly designed or the alignment between the metal bump 26 and the first bonding pad 18 is inaccurate, the conductive particles 25 are more easily laterally connected in the narrow distance between the two adjacent metal bumps 26. This will significantly decrease the functioning and reliability of the LCD module.

SUMMARY OF THE INVENTION

The object of the present invention is to provide a metal bump with an insulating sidewall and a method of making thereof to prevent adjacent metal bumps from being electrically connected by the conductive particles in the ACF.

The object of the present invention is to provide a plurality of metal bumps for connecting a nonconducting substrate and a chip. The metal bumps comprise at least a first metal bump having a first sidewall, the first sidewall comprising a first predetermined area; and at least a second metal bump having a second sidewall, the second sidewall comprising a second predetermined area adjacent to the first predetermined area; wherein at least the first predetermined area is covered with an insulating layer. In a first preferred embodiment, an insulating layer covers the entire sidewall of both the first and second metal bump. In a second preferred embodiment, predetermined portions of the first metal bump and the second metal bump are covered with an insulating layer. For example, the first predetermined area of the first sidewall may be covered with an insulating layer, while the second predetermined area of the second sidewall is also covered with an insulating layer. Alternately, the first predetermined area of the first sidewall may be covered with an insulating layer, while a third predetermined on the second sidewall but outside the second predetermined area may be covered with an insulating layer.

Another object of the present invention is to provide a method of forming a plurality of metal bumps. (a) Provide a chip whose surface comprises a plurality of metal pads. (b) Form the plurality of metal bumps on the plurality of metal pads respectively. The plurality of metal bumps comprises at least a first metal bump and at least a second metal bump. The first metal bump comprises a first sidewall having a first predetermined area covered with an insulating layer. The first predetermined area is adjacent to a second predetermined area on the sidewall of the second metal bump.

It is an advantage of the present invention that the metal bump with insulating sidewall is effective in preventing electrical shorts caused by the conductive particles 35. This can widely improve the functioning and reliability of the LCD module.

This and other objects of the present invention will no doubt become obvious to those of ordinary skill in the art after having read the following detailed description of the preferred embodiment which is illustrated in the various figures and drawings.

BRIEF DESCRIPTION OF THE DRAWINGS

The drawings referred to herein are to be understood as not being drawn to scale except where specifically noted, the emphasis instead being placed upon illustration of the principles of advantages of the present invention. In the accompanying drawings.

DETAILED DESCRIPTION OF THE PREFERRED EMBODIMENTS

First Embodiment

Figure 1A:
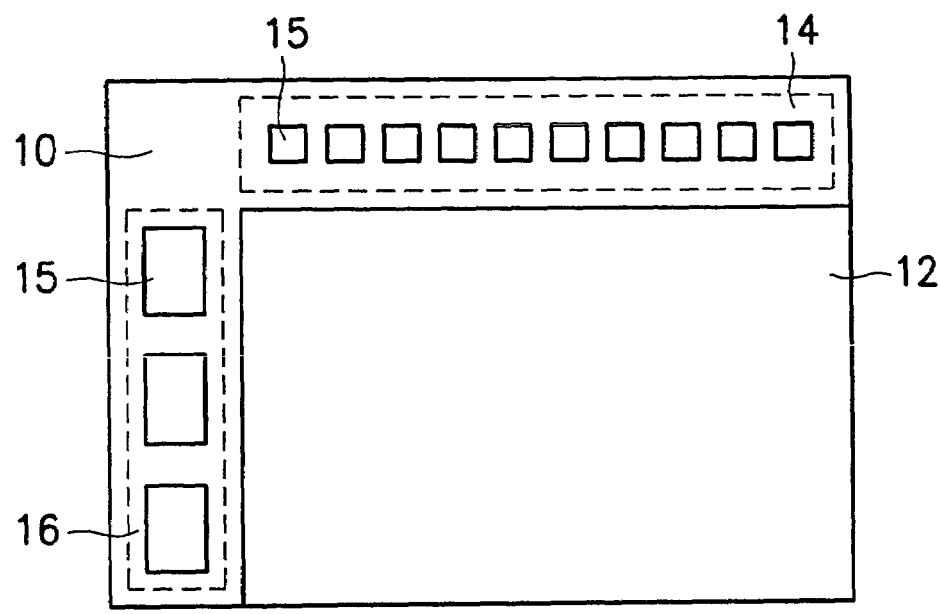
FIG. 1A is a top view of the layout of a glass substrate according to the prior art.
Figure 1B:
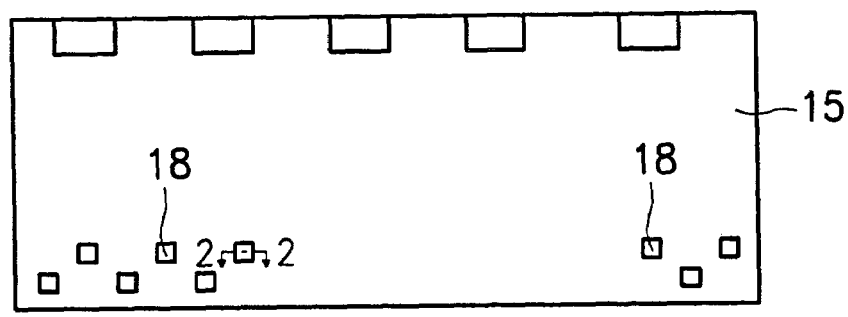
FIG. 1B is a top view of the layout of the predetermined area shown in FIG. 1A.
Figure 1C:
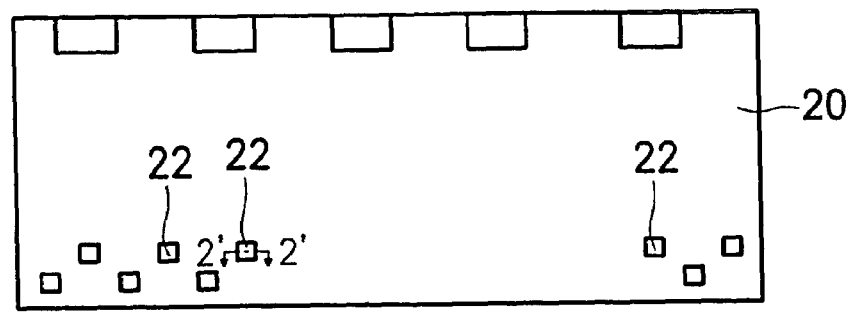
FIG. 1C is a top view of the layout of a chip according to the prior art.
Figure 2A:
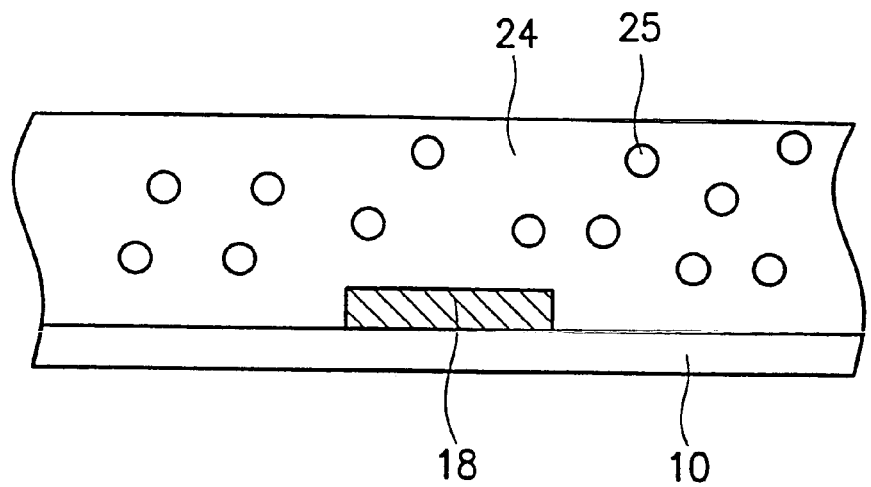
FIG. 2A to FIG. 2D are schematic cross-sectional diagrams of a method of connecting the chip and the glass substrate according to the prior art.
Figure 2B:
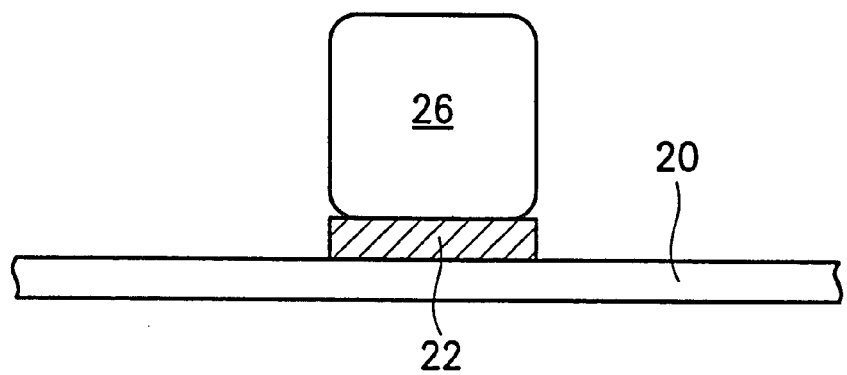
Figure 2C:
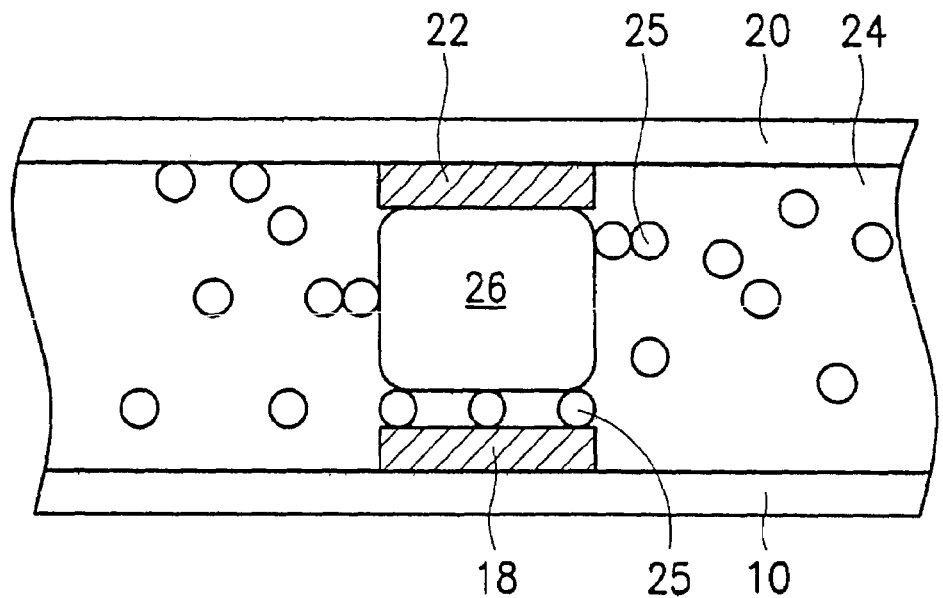
Figure 2D:
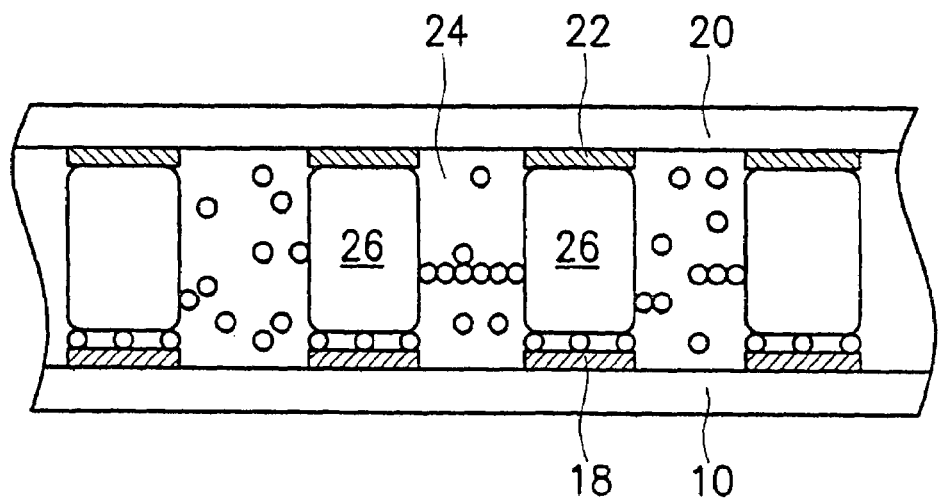
Figure 3A:
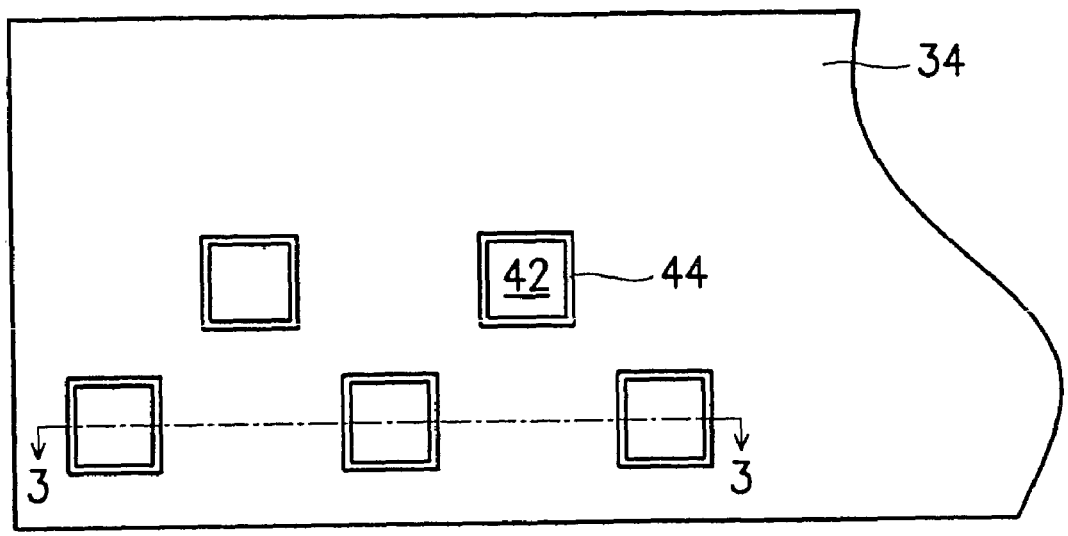
FIG. 3A is a top view of a plurality of metal bumps according the first preferred embodiment of the present invention.
Figure 3B:
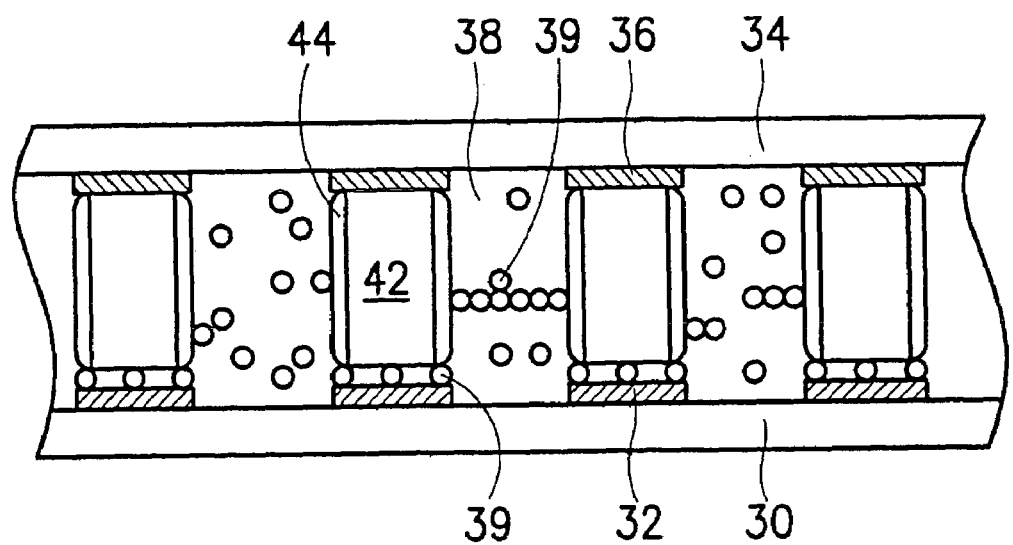
FIG. 3B is a cross-sectional diagram of the metal bump along line 3—3 shown in FIG. 3A for connecting a glass substrate and a chip 34.

Please refer to FIG. 3A and FIG. 3B. FIG. 3A is a top view of a plurality of metal bumps 42 according the first preferred embodiment of the present invention. FIG. 3B is a cross-sectional diagram of the metal bump 42 along line 3—3 shown in FIG. 3A for connecting a glass substrate 30 and a chip 34. In the first preferred embodiment of the present invention, a metal bump 42 is employed to connect a first bonding pad 32 on a glass substrate 30 and a second bonding pad 36 on a chip 34. The metal bump 42 is fabricated on the second bonding pad 36 of the chip 34, and the sidewall of the metal bump 42 is covered with an insulating layer 44 for isolating adjacent metal bumps 42. When the chip 34 is downwardly placed on a predetermined area of the glass substrate 30 corresponding to the metal bump 42 at the first bonding pad 32, the adhesion of ACF 38 attached to the glass substrate 30 binds chip 34 on the glass substrate 30. Accordingly, the conductive particles 39 that are sandwiched by the top of the metal bump 42 and the surface of the first bonding pad 32 serve as an electrically connecting bridge. In addition, since the insulating layer 44 is formed on the sidewall of each metal bump 42, the conductive particles that exist between adjacent metal bumps 42 are isolated to prevent electrical shorts from being caused by lateral connection of the conductive particles 35. In areas where the second bonding pads 36 are tightly packed, the metal bump 42 with insulating sidewalls is effective in preventing electrical shorts from the conductive particles 35. This can significantly improve the functioning and reliability of the LCD module.

Figure 4A:
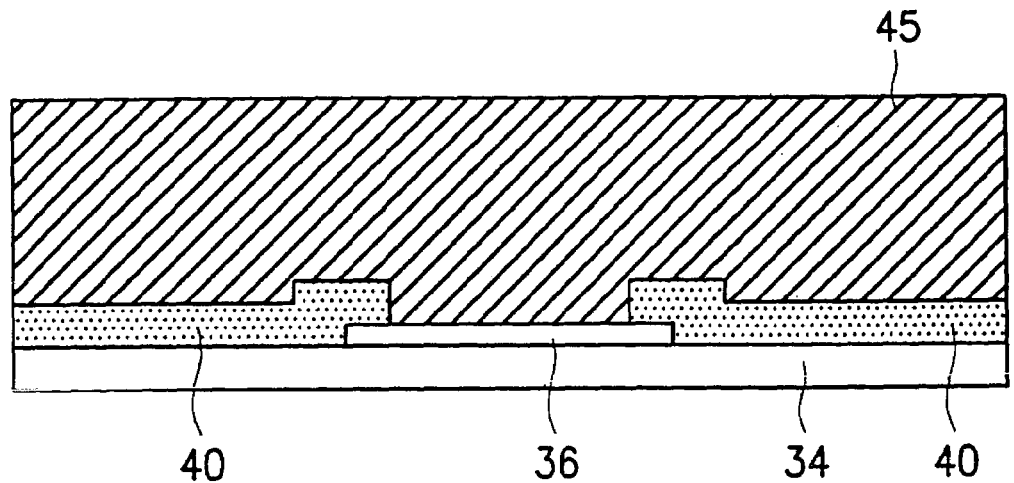
FIG. 4A to FIG. 4F are cross-sectional diagrams of a method of forming the metal bump shown in FIG. 3.
Figure 4B:
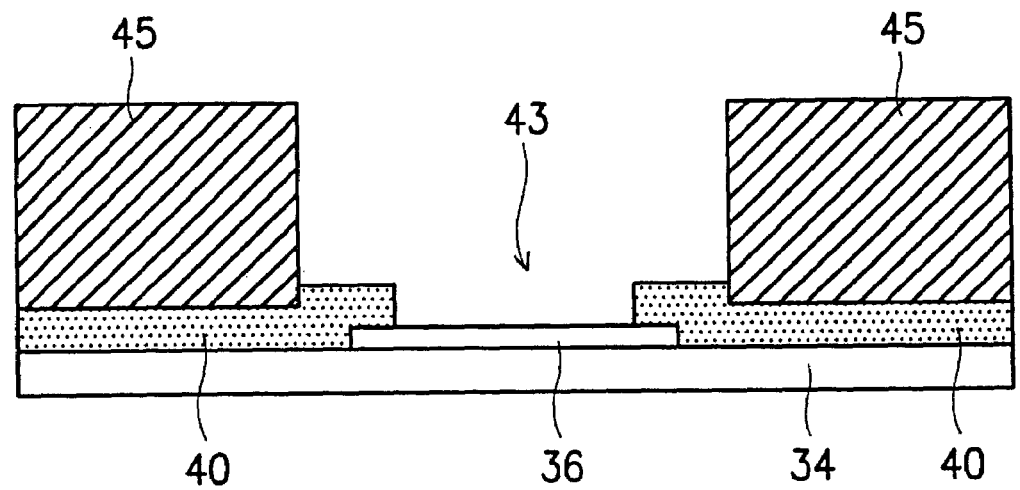
Figure 4C:
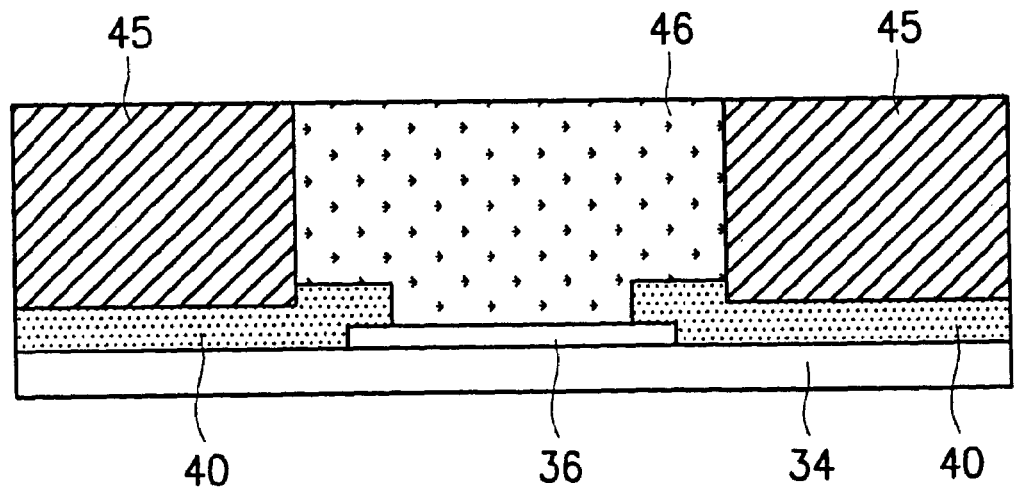
Figure 4D:
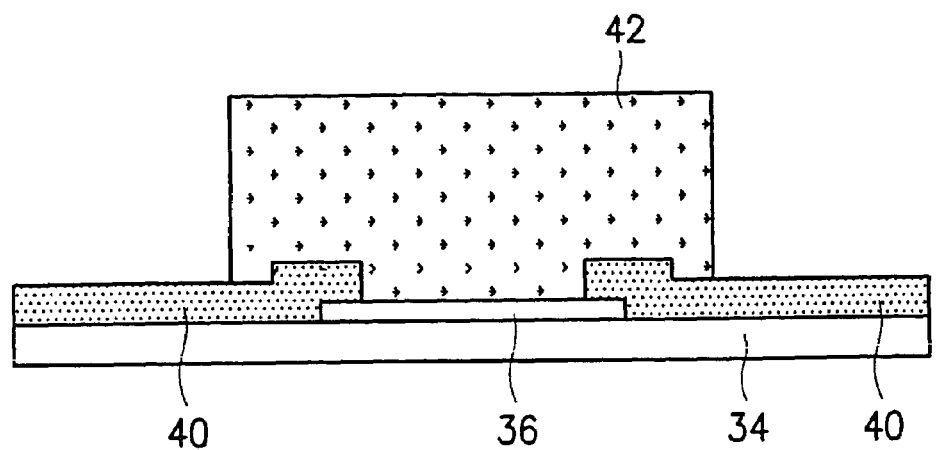
Figure 4E:
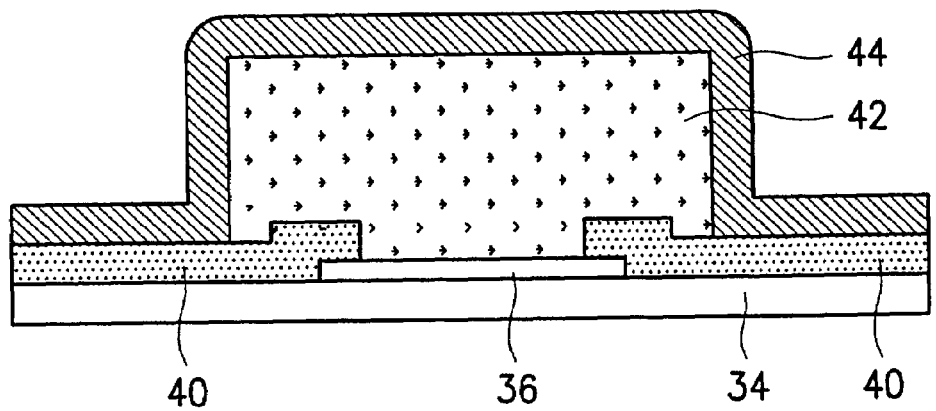
Figure 4F:
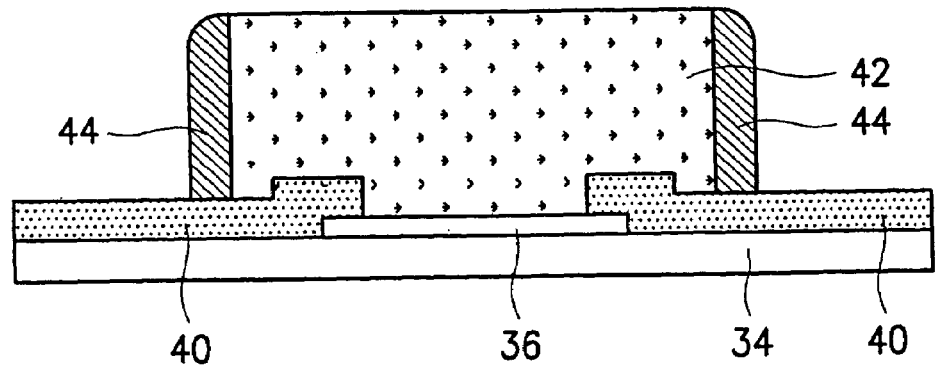

Please refer to FIG. 4A to FIG. 4F. FIG. 4A to FIG. 4F are cross-sectional diagrams of a method of forming the metal bump 42 shown in FIG. 3. As shown in FIG. 4A, the surface of the chip 34 comprises the bared second bonding pad 36 and a protective layer 40. In this embodiment, the second bonding pad 36 is made of aluminum, and the protective layer 40 is made of nitride for protecting the completed integrated circuits on the chip 34. According to a method of forming the metal bump 42 in the present invention, a photoresist layer 45 is firstly formed on the chip 34. Then, a photolithography process and etching process are employed to define the pattern of the metal bump 42 and remove a predetermined area of the photoresist layer 45 so as to form a cavity 43 that exposes the second bonding pad 36, as shown in FIG. 4B. Next, a metal layer 46 is deposited on the chip 34 to fill the cavity 43, and then the metal layer 45 positioned on the photoresist layer 45 is removed to level off the surface of the metal layer 45 positioned over the cavity 43, as shown in FIG. 4C. After completely removing the remaining photoresist layer 45, as shown in FIG. 4D, the remaining metal layer 46 serves as the metal bump 42. Next, the insulating layer 44 made of silicon oxide or silicon nitride is deposited on the chip 34 to cover the top and sidewall of the metal bump 42, as shown in FIG. 4E. Finally, as shown in FIG. 4F, by using a reactive ion etch (RIE) method to perform an anisotropic dry etching process, the insulating layer 44 positioned on the top of the metal bump 42 and on the surface of the chip 34 is removed, while the insulating layer 44 positioned on the sidewall of the metal bump 42 remains. This completes the metal bump 42 with insulating sidewalls shown in FIG. 3.

Figure 5A:
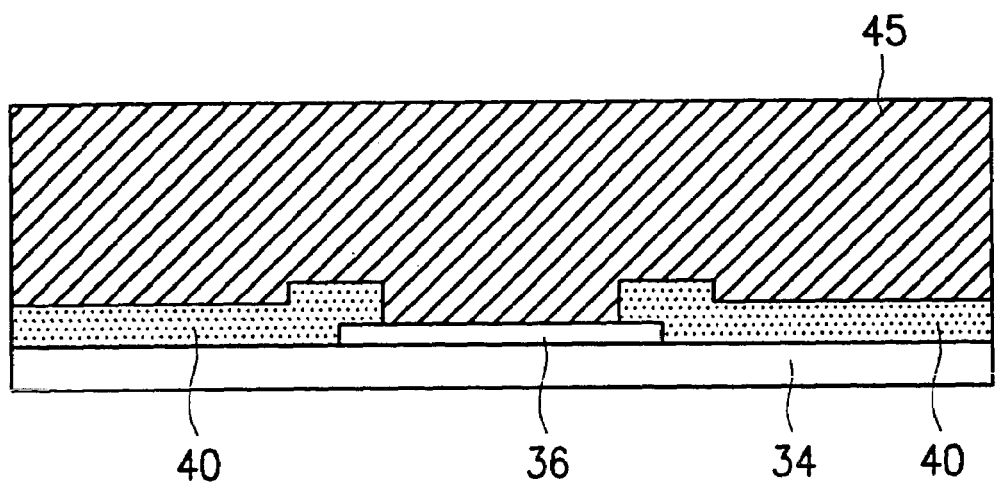
FIG. 5A to FIG. 5F are cross-sectional diagrams of another method of forming the metal bump shown in FIG. 3.
Figure 5B:
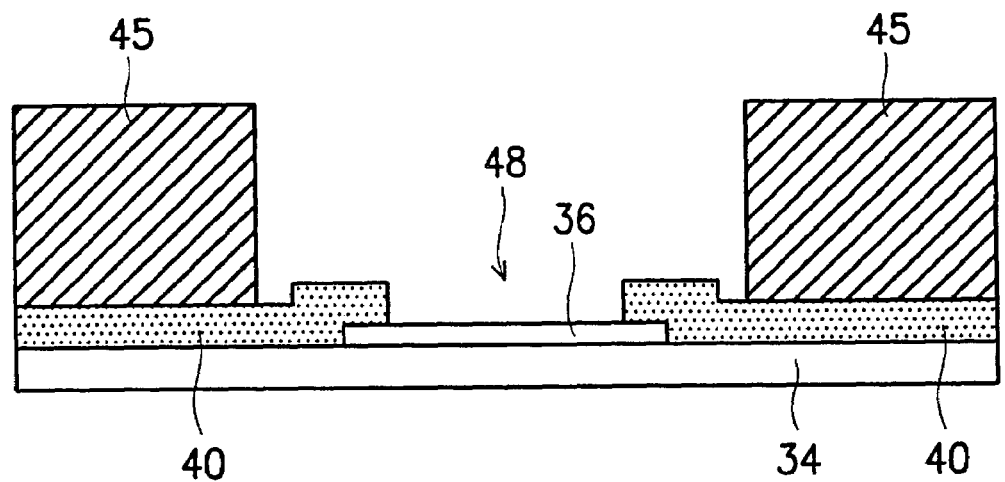
Figure 5C:
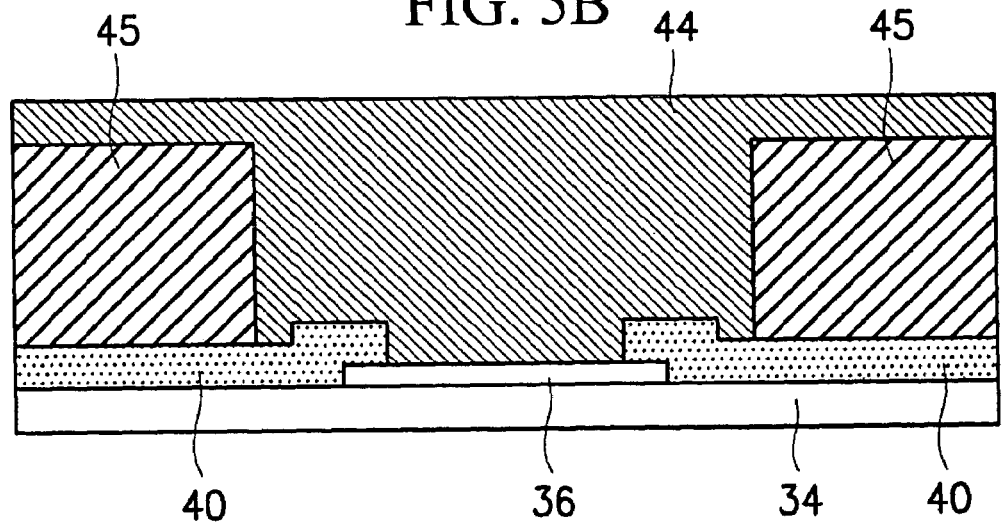
Figure 5D:
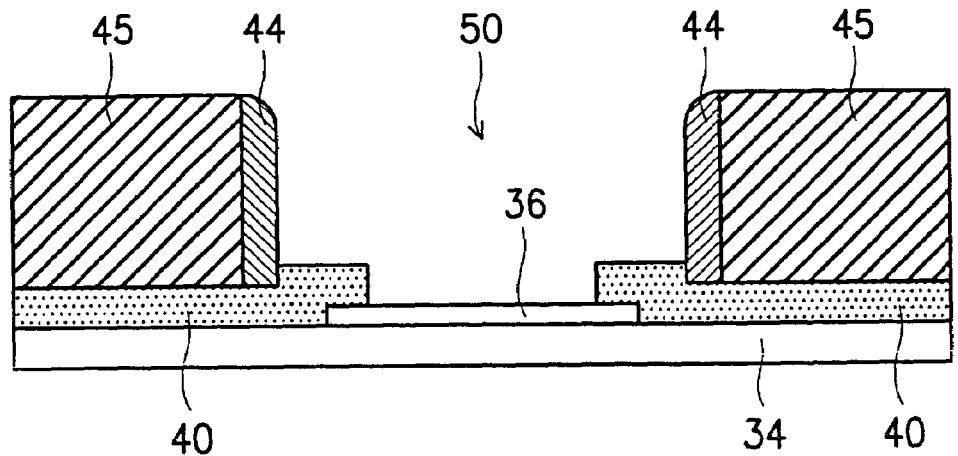
Figure 5E:
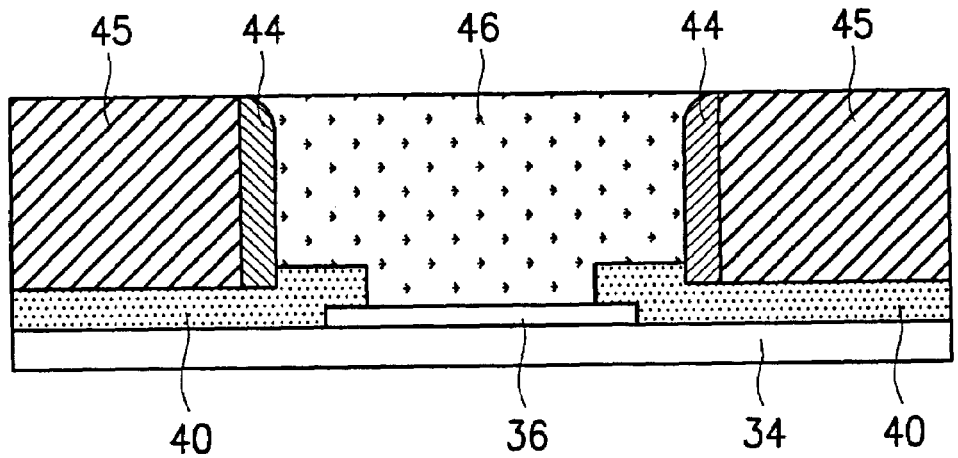
Figure 5F:
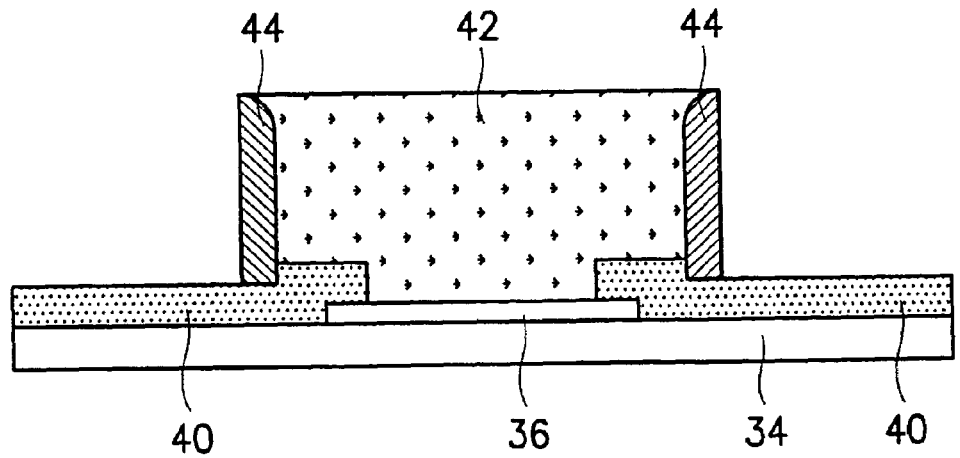

Please refer to FIG. 5A to FIG. 5F. FIG. 5A to FIG. 5F are cross-sectional diagrams of another method of forming the metal bump 42 shown in FIG. 3. According this method of forming the metal bump 42 in the present invention, a photoresist layer 45 is firstly formed on the chip 34, as shown in FIG. 5A. Then, by using a photolithography process and a first etching process, the pattern of the metal bump 42 is defined and a predetermined area of the photoresist layer 45 is removed so as to form a first cavity 48, as shown in FIG. 5B. The first cavity 48 exposes the second bonding pad 36 and part of the protective layer 40 that surrounds the second bonding pad 36. Next, as shown in FIG. 5C, the insulating layer 44 is deposited on the chip 34 to fill the first cavity 48. Next, a second etching process is performed to remove the insulating layer 44 positioned over the surface of the photoresist layer 45, the second bonding pad 36 and the protective layer 40, and remain the insulating layer 44 positioned on the sidewall of the first cavity 48 so as to form a second cavity 50, as shown in FIG. 5D. Next, the metal layer 46 is deposited on the chip 34 to fill the second cavity 50, and then the metal layer 46 positioned on the photoresist layer 45 is removed to level off the surface of the metal layer 46 positioned in the second cavity 50, as shown in FIG. 5E. Finally, as shown in FIG. 5F, after removing the photoresist layer 45, the metal layer 46 with the insulating layer 44 positioned on the sidewall is employed as the metal bump 42 as shown in FIG. 3.

Second Embodiment

Figure 6A:
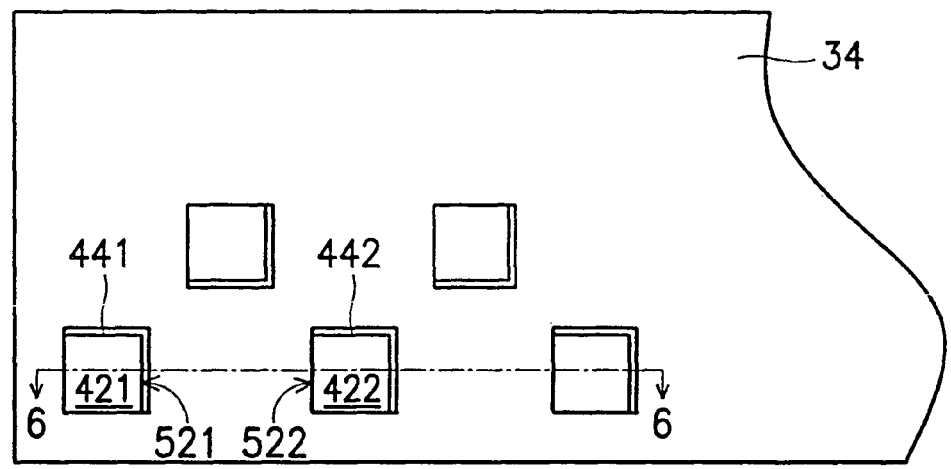
FIG. 6A is a top view of the metal bump according to the second preferred embodiment of the present invention.
Figure 6B:
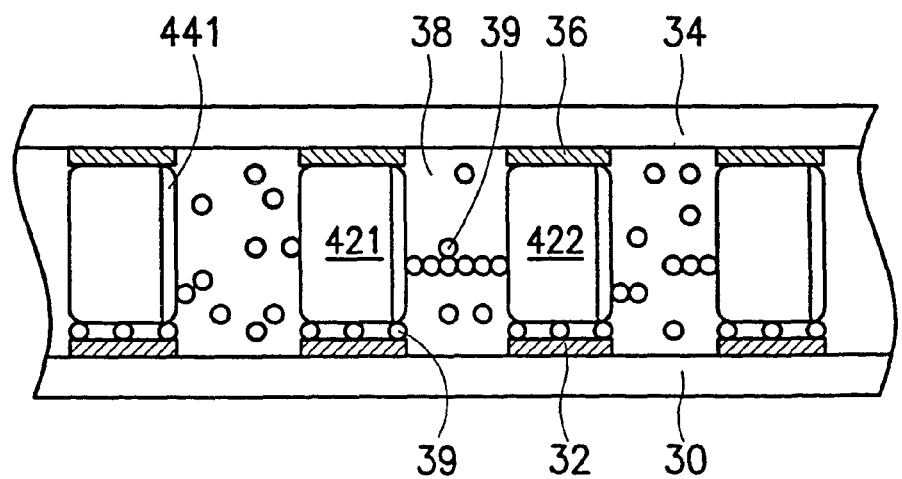
FIG. 6B is a cross-sectional diagram of the metal bump along line 6—6 shown in FIG. 6A for connecting the glass substrate and the chip.

Insulating layer 44 can achieve the purpose of isolating adjacent metal bumps 42 by covering only specific areas of the sidewalls of the metal bumps 42. Please refer to FIG. 6A and FIG. 6B. FIG. 6A is a top view of the metal bump 42 according to the second preferred embodiment of the present invention. FIG. 6B is a cross-sectional diagram of the metal bump 42 along line 6—6 shown in FIG. 6A for connecting the glass substrate 30 and the chip 34. According to the second preferred embodiment, the chip 34 has a plurality of metal bumps 42 comprising at least a first metal bump 421 and at least a second metal bump 422, wherein a first predetermined area 521 on the sidewall of the first metal bump 421 is adjacent to a second predetermined area 522 on the sidewall of the second metal bump 422. In order to isolate the first predetermined area 521 and the second predetermined area 522, a first insulating layer 441 is formed to cover the first predetermined area 521 on the sidewall of the first metal bump 421. No insulating layer is needed for covering the second predetermined area. With regard to other areas on the sidewall of the second metal bump 422, a second insulating layer 442 can be selectively formed on a specific area depending on the isolation effect in demand. The first insulating layer 441 isolates the conductive particles 39 that exist between the first predetermined area 521 and the second predetermined area 522, preventing electrical shorts caused by the lateral connection of the conductive particles 39. This improves the functioning and reliability of the LCD products.

Those skilled in the art will readily observe that numerous modifications and alterations of the device may be made while retaining the teaching of the invention. It is understood, for example, that only the two adjacent areas of the sidewalls of adjacent metal bumps could be covered with an insulating layer. Accordingly, the above disclosure should be construed as limited only by the metes and bounds of the appended claims.

What is claimed is:

1. A method of forming a plurality of metal bumps, comprising:
    providing a chip whose surface comprises a plurality of metal pads;
    forming a photoresist layer on the chip;
    performing a first etching process to remove the photoresist layer that covers the surface and periphery of the metal pad so as to form a first hole that exposes the metal pad;
    depositing an insulating layer on the chip to fill the first hole;
    performing a second etching process to remove the insulating layer positioned on the surface of the metal pad and to leave the insulating layer positioned on the sidewall of the first hole, and thereby a second hole is formed;
    filling the second hole with a metal layer; and
    removing the remaining photoresist layer.

2. The method of claim 1, wherein the metal layer is made of Au.

3. The method of claim 1, wherein the insulating layer is made of silicon oxide or silicon nitride.

4. The method of claim 1, wherein the metal bump is used for connecting the chip with a nonconducting substrate and the space between two adjacent metal bumps is filled with an anisotropic conductive film (ACF).

* * * * *